(12) United States Patent
Myers et al.

(10) Patent No.: US 11,243,250 B2
(45) Date of Patent: Feb. 8, 2022

(54) TESTING AN ARRAY OF INTEGRATED CIRCUITS FORMED ON A SUBSTRATE SHEET

(71) Applicant: ARM LIMITED, Cambridge (GB)

(72) Inventors: James Edward Myers, Cambridge (GB); John Philip Biggs, Cambridge (GB); Jedrzej Kufel, Cambridge (GB)

(73) Assignee: Arm Limited, Cambridge (GB)

( * ) Notice: Subject to any disclaimer, the term of this patent is extended or adjusted under 35 U.S.C. 154(b) by 264 days.

(21) Appl. No.: 16/483,190

(22) PCT Filed: Dec. 19, 2017

(86) PCT No.: PCT/GB2017/053806
§ 371 (c)(1),
(2) Date: Aug. 2, 2019

(87) PCT Pub. No.: WO2018/142094
PCT Pub. Date: Aug. 9, 2018

(65) Prior Publication Data
US 2019/0361072 A1    Nov. 28, 2019

(30) Foreign Application Priority Data
Feb. 6, 2017    (GB) .................................... 1701917

(51) Int. Cl.
*G01R 31/317* (2006.01)
*G01R 31/3183* (2006.01)
(Continued)

(52) U.S. Cl.
CPC ... *G01R 31/31718* (2013.01); *G01R 31/3183* (2013.01); *G01R 31/31721* (2013.01); *H01L 22/34* (2013.01); *H01L 25/50* (2013.01)

(58) Field of Classification Search
None
See application file for complete search history.

(56) References Cited

U.S. PATENT DOCUMENTS

| 4,719,411 A * | 1/1988 | Buehler | ................ G11C 29/02 324/73.1 |
| 5,446,395 A | 8/1995 | Goto | |

(Continued)

FOREIGN PATENT DOCUMENTS

JP    2000-49205    2/2000

OTHER PUBLICATIONS

International Search Report and Written Opinion of the ISA for PCT/GB2017/053806, dated Feb. 16, 2018, 12 pages.

(Continued)

*Primary Examiner* — Jermele M Hollington
(74) *Attorney, Agent, or Firm* — Nixon & Vanderhye P.C.

(57) ABSTRACT

Integrated circuits (12) are manufactured by printing an array of circuit elements CE each containing an integrated circuit and associated testing circuitry (14). A plurality of integrated circuits within the array are tested in parallel to generate a corresponding plurality of individual test result signals. These individual test result signals are combined to form a combined test result signal indicating whether any of the plurality of integrated circuits tested in parallel operated incorrectly during their testing. If the combined test result signal indicates any faulty integrated circuits, then the entire plurality of integrated circuits (e.g. an entire row or column) may be discarded. The array of tested integrated circuits are then separated into discrete integrated circuits and are also separated from their testing circuit. Contacts (16, 18, 20) providing power signals, clock signals, and the reading of the combined test result signals are located at the periphery of a substrate sheet onto which the array of circuit elements are printed.

19 Claims, 8 Drawing Sheets

(51) Int. Cl.
*H01L 21/66* (2006.01)
*H01L 25/00* (2006.01)

(56) References Cited

U.S. PATENT DOCUMENTS

| | | | |
|---|---|---|---|
| 6,233,184 B1 | 5/2001 | Barth et al. | |
| 6,836,133 B2* | 12/2004 | Kinoshita | H01L 22/34 |
| | | | 324/750.3 |
| 9,003,254 B2* | 4/2015 | Ma | G06F 11/26 |
| | | | 714/736 |
| 2002/0194565 A1 | 12/2002 | Arabi | |
| 2003/0146771 A1 | 8/2003 | Moore | |
| 2005/0146013 A1 | 7/2005 | Farnworth et al. | |
| 2015/0200146 A1 | 7/2015 | Reber et al. | |
| 2016/0276231 A1 | 9/2016 | Liu et al. | |
| 2019/0371798 A1* | 12/2019 | Yamazaki | H01L 29/66969 |
| 2021/0175283 A1* | 6/2021 | Wang | G01L 1/16 |

OTHER PUBLICATIONS

Combined Search and Examination Report for GB1701917.5, dated Jun. 22, 2017, 6 pages.

Myers, "PlasticARM: SOC design challenges of printed electronics", ARM Research Summit, Sep. 16, 2016, 12 pages.

Kumar et al., "An Approach to Simultaneously Test Multiple Devices for High-Throughput Production of Thin-Film Electronics", Journal of Display Technology, vol. 12, No. 3, Mar. 2016, 7 pages.

\* cited by examiner

TESTING AN ARRAY OF INTEGRATED CIRCUITS FORMED ON A SUBSTRATE SHEET

This application is the U.S. national phase of International Application No. PCT/GB2017/053806 filed 19 Dec. 2017, which designated the U.S. and claims priority to GB Patent Application No. 1701917.5 filed 6 Feb. 2017, the entire contents of each of which are hereby incorporated by reference.

This disclosure relates to the field of data processing systems. More particularly, this disclosure relates to the testing of integrated circuits.

BACKGROUND

There have been proposed techniques for printing integrated circuits such as roll-to-roll printing and sheet-to-sheet printing. Such techniques are suited to producing high volume and low cost integrated circuits (typically at the expense of circuit density and performance). Such low cost integrated circuits may find use in applications such as, for example, disposable packaging where conventional higher cost integrated circuits are too expensive. In the context of low cost integrated circuit manufacture, the testing for the correct operation of an integrated circuit when it has been manufactured is an increasing overhead and accordingly an increasing cost component in the overall cost of the integrated circuit.

SUMMARY

At least some embodiments of the present disclosure provide a method of manufacturing integrated circuits comprising the steps of:

forming an array comprising a plurality of circuit elements, a circuit element comprising an integrated circuit and a testing circuit to test for correct operation of said integrated circuit;

testing in parallel a plurality of said integrated circuits using respective testing circuits to generated a plurality of test result signals;

combining said plurality of test result signals to form a combined test result signal having a first value when any of said plurality of test result signals indicates that a corresponding integrated circuit operated incorrectly during said testing and a second value when all of said plurality of test result signals indicate that said plurality of integrated circuits operated correctly during said testing; and separating said array to form a plurality of discrete integrated circuits.

At least some embodiments of the present disclosure provide an array of circuit elements, a circuit element comprising an integrated circuit and a testing circuit to test for correct operation of said integrated circuit, wherein said integrated circuits and said testing circuits are connected:

to test in parallel a plurality of said integrated circuits using respective testing circuits to generated a plurality of test result signals; and to combine said plurality of test result signals to form a combined test result signal having a first value when any of said plurality of test result signals indicates that a corresponding integrated circuit operated incorrectly during said test and a second value when all of said plurality of test result signals indicate that said plurality of integrated circuits operated correctly during said test, and wherein said array is formed to be separated to provide discrete integrated circuits for non-test operations.

BRIEF DESCRIPTION OF THE DRAWINGS

Example embodiments will now be described, by way of example only, with reference to the accompanying drawings in which.

DESCRIPTION OF EXAMPLE EMBODIMENTS

Figure 1:
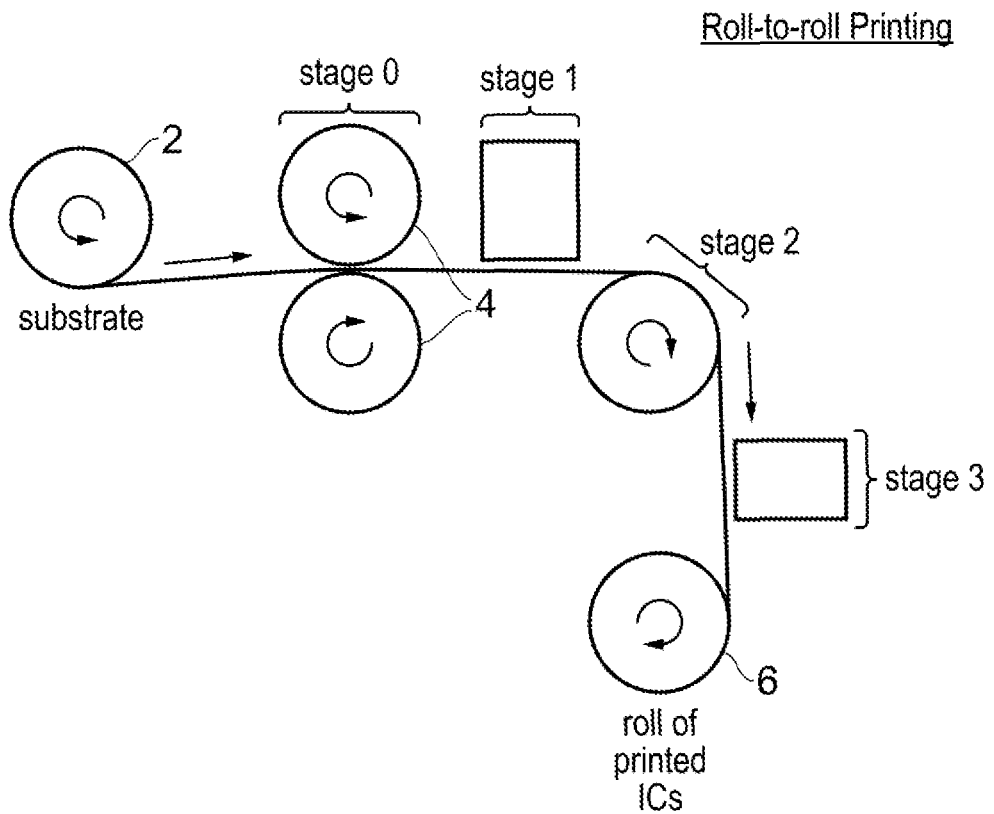
FIG. 1 schematically illustrates roll-to-roll printing of integrated circuits.

FIG. 1 schematically illustrates roll-to-roll printing of integrated circuits using a forming apparatus. A roll of flexible substrate 2 is unwound and pressed between a zeroth stage pair of rollers 4 where a zeroth stage processing step is applied as part of printing the integrated circuits and accompanying testing circuits which form circuit elements (CE) printed as an array upon the substrate. The processing step applied in the zeroth stage could have a variety of different forms, such as depositing a metal layer, depositing a semi conductor layer, depositing an etchant or the like. In practice, multiple processing stages are applied in the printing process of FIG. 1 and can each take a variety of different forms. When these processing stages are performed in sequence the desired integrated circuits and testing circuit are formed as an array on the substrate as it passes through the apparatus. Such roll-to-roll printing of integrated circuits may be a continuous process in which the substrate is continuously moving. This is suited to high volume and low cost production. At the end of the process illustrated in FIG. 1, the substrate is collected onto a roll of printed integrated circuits 6. It is possible that such a roll of printed integrated circuits 6 may subsequently be subject to testing to identify any incorrectly operating integrated circuits which have been formed so that these may be discarded and so avoid their use in the manufacture of articles that would fail. It is also possible that the testing and discarding could take place as a final stage in the printing process itself.

In such high volume and low cost manufacturing of integrated circuits, the time taken to test the integrated circuits for correct operation becomes a significant overhead. The present techniques address this by testing a plurality of the integrated circuits in parallel, combining their test results to produce a combined test result and then, in at least some embodiments, discarding all of the integrated circuits corresponding to a combined test result signal which indicates that at least one of integrated circuits concerned is faulty (not operating correctly). In practice it can be less expensive to discard an entire group of integrated circuits containing at least one faulty integrated circuit than to conduct the additional testing necessary to identify an individual integrated circuit(s) which is(are) faulty.

Figure 2:
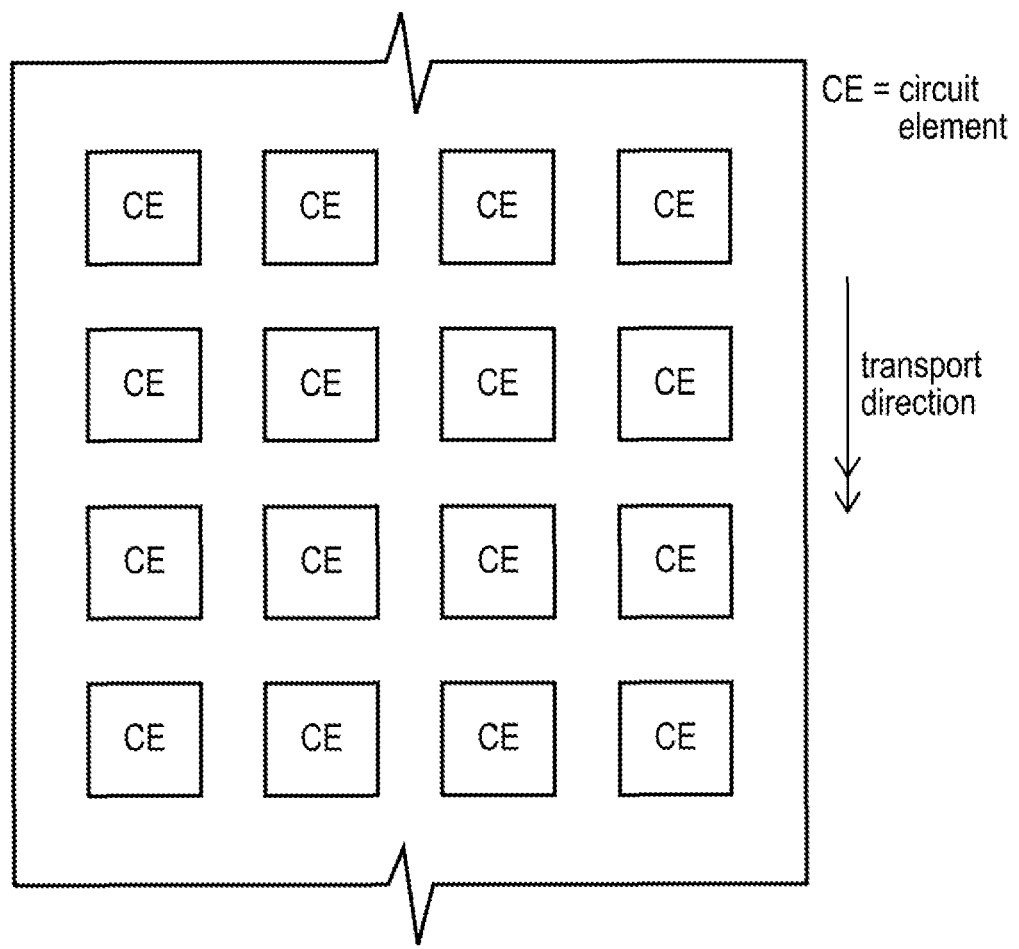
FIG. 2 schematically illustrates an array of circuit elements manufactured using roll-to-roll printing.

FIG. 2 schematically illustrates an array of circuit elements (CE) printed on a substrate moving through a roll-to-roll printing process as illustrated in FIG. 1. In the example of FIG. 2, the rows of circuit elements transverse to the transport direction of the substrate are shown as containing four circuit elements. It will be appreciated that in practice this number will typically be much larger and accordingly if the circuit elements are tested on a row-by-row basis with the test result signals for all of the integrated circuits within a row being combined, then the combined test result signal may represent the test results of a large number of integrated circuits within an entire row. Nevertheless, it can be more cost effective to discard an entire row containing a large number of integrated circuits than to slow the manufacturing process to provide for individual testing of integrated circuits.

Figure 3:
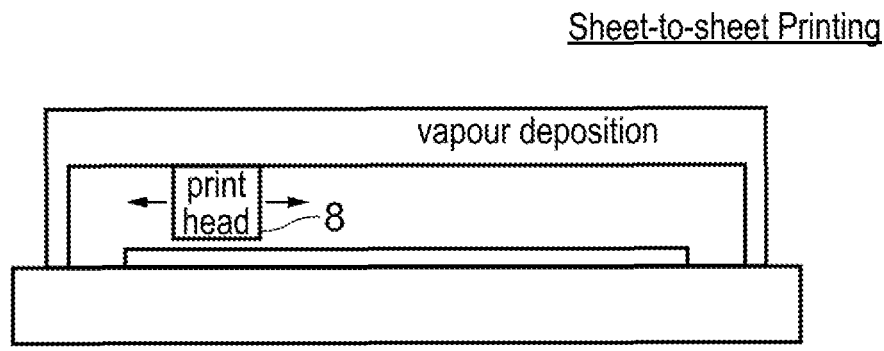
FIG. 3 schematically illustrates sheet-to-sheet printing.

FIG. 3 schematically illustrates another printing technique, namely sheet-to-sheet printing. In this process the integrated circuits are formed layer-by-layer using processing steps such as printing via a movable print head 8 and vapour deposition performed across the entire substrate. When the circuit elements containing the integrated circuits and testing circuits have been fully formed, then the entire sheet of integrated circuits is tested with multiple circuit elements tested in parallel so as to reduce the test time and accordingly test cost. The individual integrated circuits which have passed their tests may then, for example, be laser cut and freed from the sheet with the defective integrated circuits left behind in place so as to be discarded.

Figure 4:
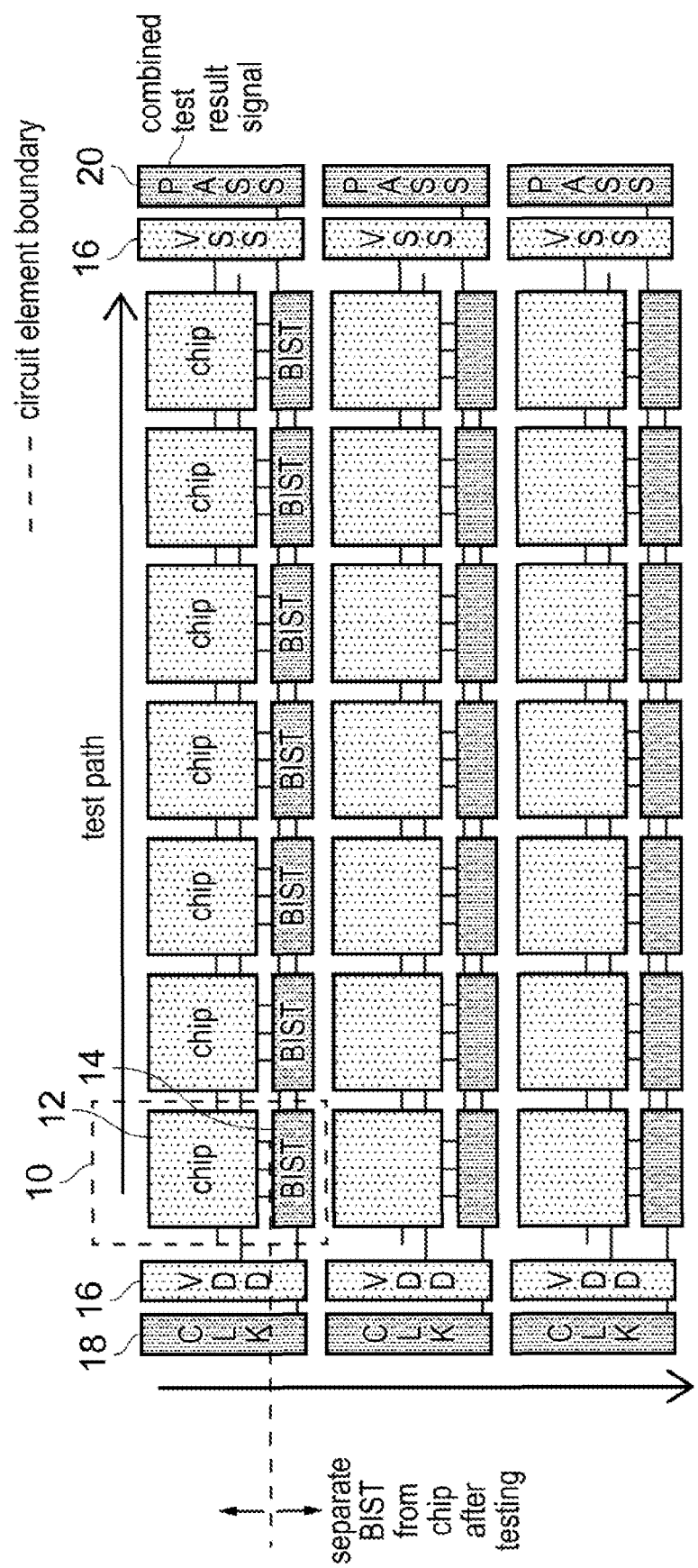
FIG. 4 schematically illustrates an array of circuit elements with rows of circuit elements being tested in parallel.

FIG. 4 schematically illustrates in more detail a portion of a flexible substrate of which circuit elements have been formed by roll-to-roll printing. The circuit elements 10 each comprise an integrated circuit 12, which is being manufactured, and an associated testing circuit 14. Integrated circuits 12 within each circuit element are discrete integrated circuits which during their intended operation function separately from other integrated circuits, i.e. the integrated circuits 12 within the array illustrated in FIG. 4 are separated and used within separate manufactured items and do not depend in their operation upon each other. After the printing process has completed, the array is separated with the individual integrated circuits 12 being separated from one another and the testing circuits 14 being separated from their associated integrated circuits 12. There is no need for the testing circuit 14 to be built in and form part of the final product into which the integrated circuit 12 is to be incorporated. For ease of design and manufacture the circuit elements 10 may be substantially identical in each of their instances within the array.

As illustrated in FIG. 4, the integrated circuits 12 are each subject to a test for correct operation by their associated testing circuitry 14 on a row-by-row basis. Accordingly, the testing of the integrated circuits 12 of a given row is performed in parallel when power is applied to the given via power supply contacts 16 and a clock signal is applied by clock signal contact 18 to the given row. The power supply and the clock signal are routed along a test path corresponding to the given row of circuit elements being tested. This test path in this example embodiment extends from proximal to a first edge of the substrate near the clock signal contact 18 to a second edge of the substrate proximal to a combined test result signal contact 20. The combined test result signal is read from the combined test result signal contact 20 and indicates whether any of the integrated circuits 12 within the given row is/are faulty. If any of the integrated circuits 12 within the given row are faulty, then the combined test results signal will have a first value (e.g. 0) and, if all of the integrated circuits 12 within the given row are not faulty, then the combined test result signal will have a second value (e.g. 1). It would also be possible in other example embodiments to place the contacts toward the middle of the roll.

Figure 5:
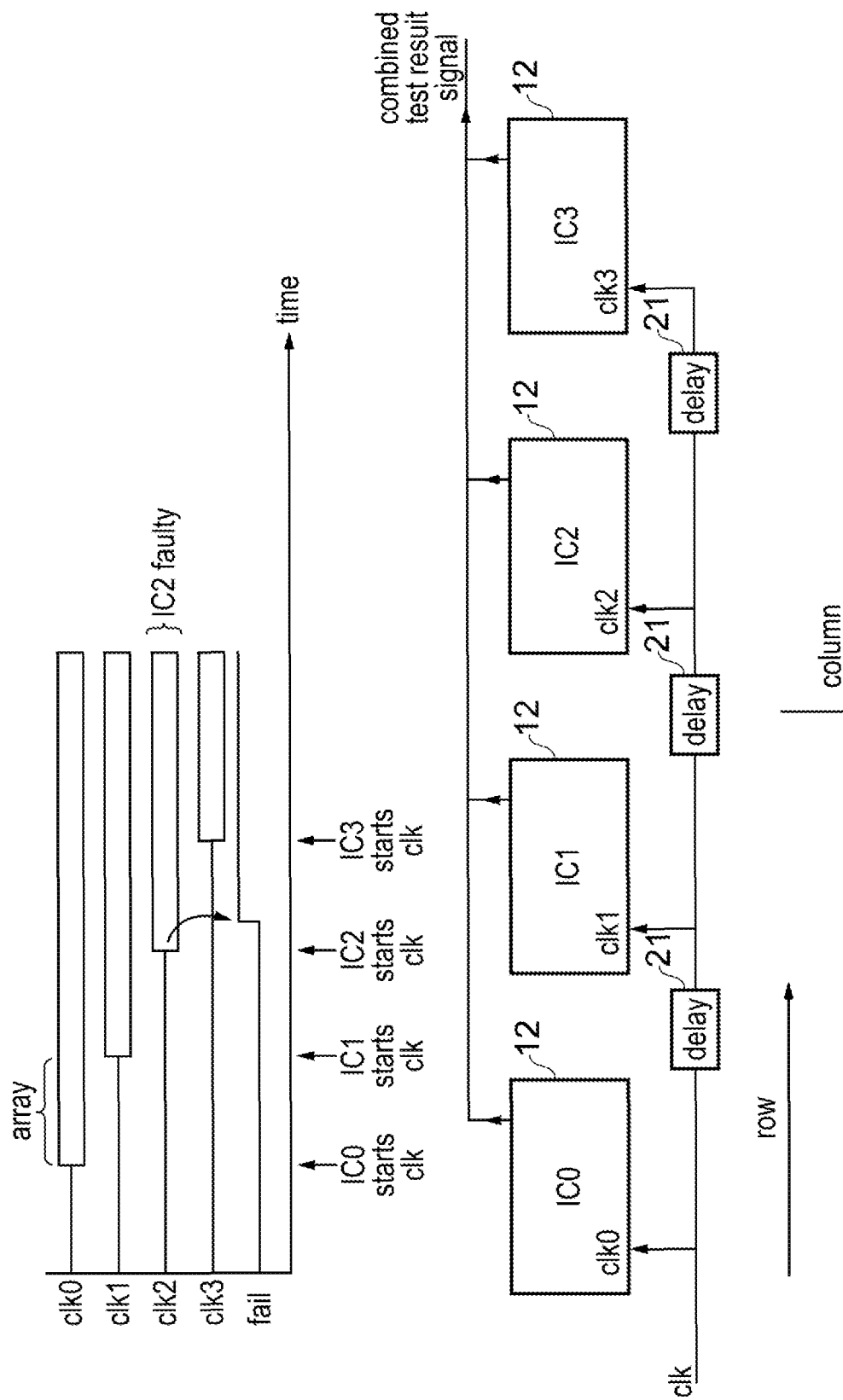
FIG. 5 schematically illustrates an example embodiments in which the time at which each integrated circuit within a row starts to be clocked/tested varies along the row.

In other example embodiments, as illustrated in FIG. 5, the clock signal applied to a row of integrated circuits under test can be delayed (e.g. by delay circuits 21) as it propagates along the row (such as by one clock signal period) such that the timing with which the combined test result signal changes to indicate a fault will indicate the position within the row of the first faulty integrated circuit 12 within that row to be detected. For example if the row contains four integrated circuits 12 and the third integrated circuits 12 to be clocked is faulty, then the time at which the combined test result signal changes to indicate the fault will correspond to the time that clock signal reaches that third integrated circuit 12. The clock signal thus propagates along the row with a known timing (e.g. by including delay circuits 21 in the clock signal path between each column) and the timing of the occurrence of a fault indicating combined test result signal indicates the position of the first encountered faulty integrated circuit within that row (further faulty integrated circuits 12 may or may not be present later in the row). In this way it is possible to identify at least some of the integrated circuits 12 that precede the faulty integrated circuit in being clock as non-faulty integrated circuits 12 that need not be discarded. This reduces waste.

It will be appreciated that the length of the contacts 16, 18, 20 relative to the speed of movement of the substrate in the transport direction of the substrate determines the time available for the testing. With typical modern integrated circuits 12 and testing circuits 14, testing to identify faulty integrated circuits with a high degree of reliability (at least upon a pass/fail basis) may be performed in the time available as constrained by the size of the contacts 16, 18, 20.

Figure 6:
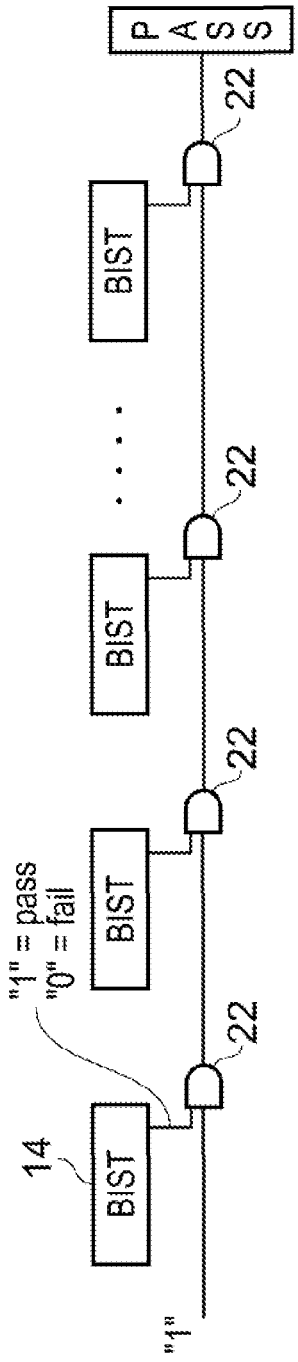
FIG. 6 schematically illustrates the combination of test result signals from individual circuit elements to form a combined test results signal.

FIG. 6 schematically illustrates forming the combined test results signal from the individual test results signal. Each individual testing circuit 14 generates a test result signal which in this example is "1" if the integrated circuit 12 is not faulty and is "0" if the integrated circuit 12 is faulty. These individual test result signals are combined using respective AND gates 22 with the output from the AND gate 22 from the preceding circuit element along the test path. The first circuit element along the test path is seeded with an input "1" tied off to this value. In this way, the output from the final circuit element 10 along the test path which is supplied to the combined test result signal contact 20 is a logical AND of the individual test result signals from each of the circuit elements 10 along that test path. It will be appreciated that if different values are used for the pass and fail indication, then a different logical combination may be used e.g. OR gates in the case of the "0" indicating non-faulty and "1" indicating faulty.

Figure 7:
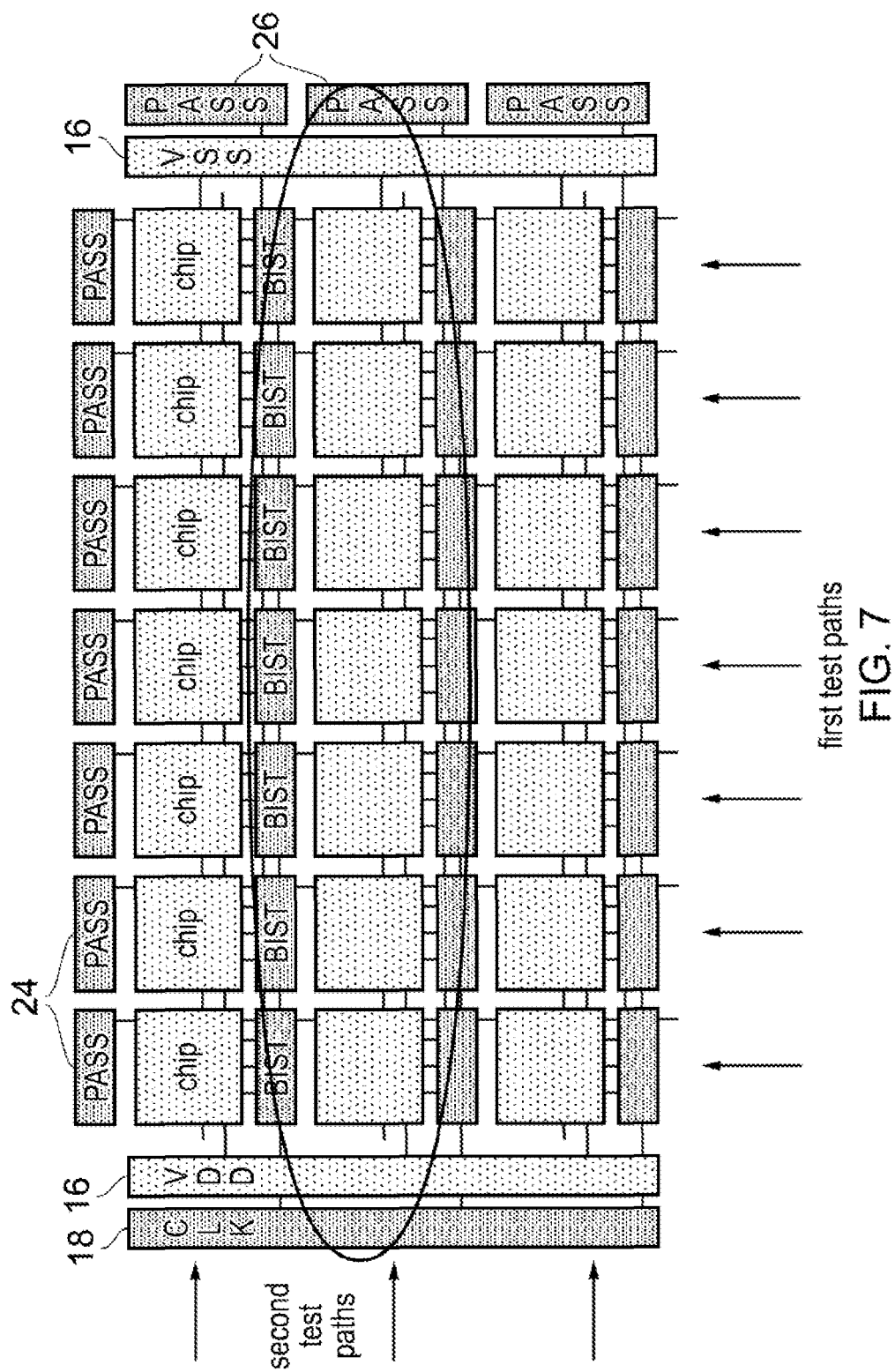
FIG. 7 schematically illustrates an array of circuit elements with rows and columns of circuit elements being tested in parallel.

FIG. 7 schematically illustrates an example embodiment in which the plurality of integrated circuits tested in parallel is a two-dimensional test block of circuit elements. In this example embodiment multiple rows and columns of circuit elements are tested in parallel. The individual test result signals from the columns running through the block corresponding to a plurality of first test paths are combined and output at combined test result signal contacts 24. The outputs at these combined test result signal 24 indicate whether any of the integrated within their respective columns are faulty. At the same time the individual test result signals for all of the integrated circuits within each row are combined on a row-by-row basis and form a combined test result signal output at a combined test result signal contact 26. The combined test result signal output at each of the combined test result signal contacts 26 indicates whether any of the integrated circuits within the corresponding row of integrated circuits is faulty. In this way it is possible that individual integrated circuits which are faulty may be identified by combining the column-by-column combined test result signals and the row-by-row combined test result signals.

If a number of faulty integrated circuits arise together in relatively close proximity, then it may not be possible to unambiguously identify individual faulty integrated circuits, but nevertheless the number of integrated circuits which are potentially faulty may be identified more closely such that fewer need be discarded. As will be discussed later, it is possible to have additional testing paths through the array, and for which the individual test result signals are combined, for the purpose of further disambiguation of which individual integrated circuit are faulty at any given time.

As will be seen in FIG. 7, the first test paths extend along the columns from a first edge of the array to a second edge opposite the first edge. The second test paths extend from a third edge of the array to a fourth edge of the array opposite the third edge.

As shown in FIGS. 4 and 7, electrical power is supplied in parallel to the plurality of integrated circuits 12 and their respective testing circuits 14 using power conductors which extend across the array to the power connection 16 at the edges of the array. In a similar way, a clock signal is supplied in parallel to the integrated circuits 12 and the respective testing circuits 14 which are to be tested in parallel via a clock conductor extending across the array from a clock connection 18 at one edge of the array.

Figure 8:
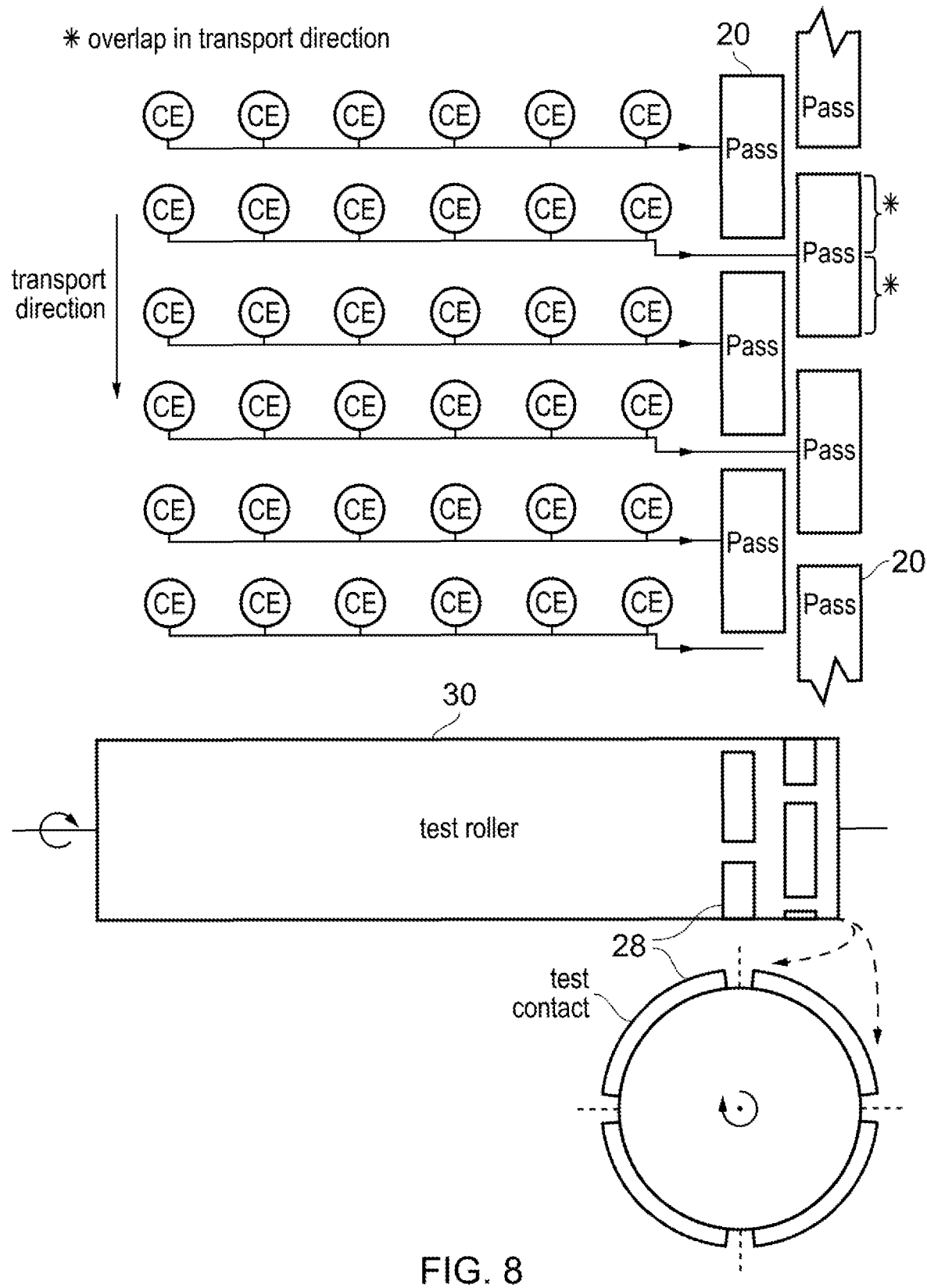
FIG. 8 schematically illustrates an array of circuit elements with contacts at the edge of the array for the reading of a combined test signal an having an overlap in the transport direction.

FIG. 8 schematically illustrates an array of circuit elements subject to testing in accordance with the present techniques and utilising roll-to-roll manufacture. In this example embodiment, two columns of combined test result signal contact 12 are provided at one lateral edge of the substrate relative to the transport direction. In this example embodiment the provision of multiple columns of combined test result signal contacts 12 allows the test result signal contacts 20 to be made longer in the transport direction thereby extending the testing time available (as previously discussed). The combined test result signal contacts 20 extend in the transport direction of the sheet by a distance which is matched to a pitch distance (repeat distance) of the circuit elements within the array. In the example illustrated in FIG. 8, the contacts 20 are matched to the pitch and correspond to two rows within the array. It would also be possible, for example, to provide three columns of contacts 20 with their extent in the transport direction matched to a distance corresponding to three rows of circuit elements and so forth. As will be seen in FIG. 8, the contacts 20 within respective columns overlap in the transport direction. Furthermore, the parallel testing of the circuit elements within each row will overlap in time with the parallel testing of an adjacent row such that in the example of FIG. 8 (excluding cross over time), two rows will be separately tested in parallel (for at least part of their testing time).

FIG. 8 also schematically illustrates a test roller 30 used for reading the combined test result signals from the contacts 20. The test roller 30 also includes contacts for supplying the power supply and the clock signal, but these are omitted from FIG. 8 for sake of clarity. The circumferential length of the test contacts 28 on the test roller 30 is matched to the respective lengths of the combined test result signal contacts 20 on the substrate. The relative phase between the pattern of the contacts 20 on the substrate and the test contacts 28 on the test roller 30 is controlled such that these phases match and an individual test contact 28 on the test roller 30 makes contact with the corresponding combine test result signal contact 20 on the substrate for the available time. In the example illustrated in FIG. 8, this contact period corresponds to the time taken for a quarter revolution of the test roller 30. In practice different arrangements are possible and the test roller 30 could be designed with only two rather than four test contacts around its circumference with the connection between the test contact 28 and the combined test result signal contact 20 persisting for half a revolution of the test roller 30.

Figure 9:
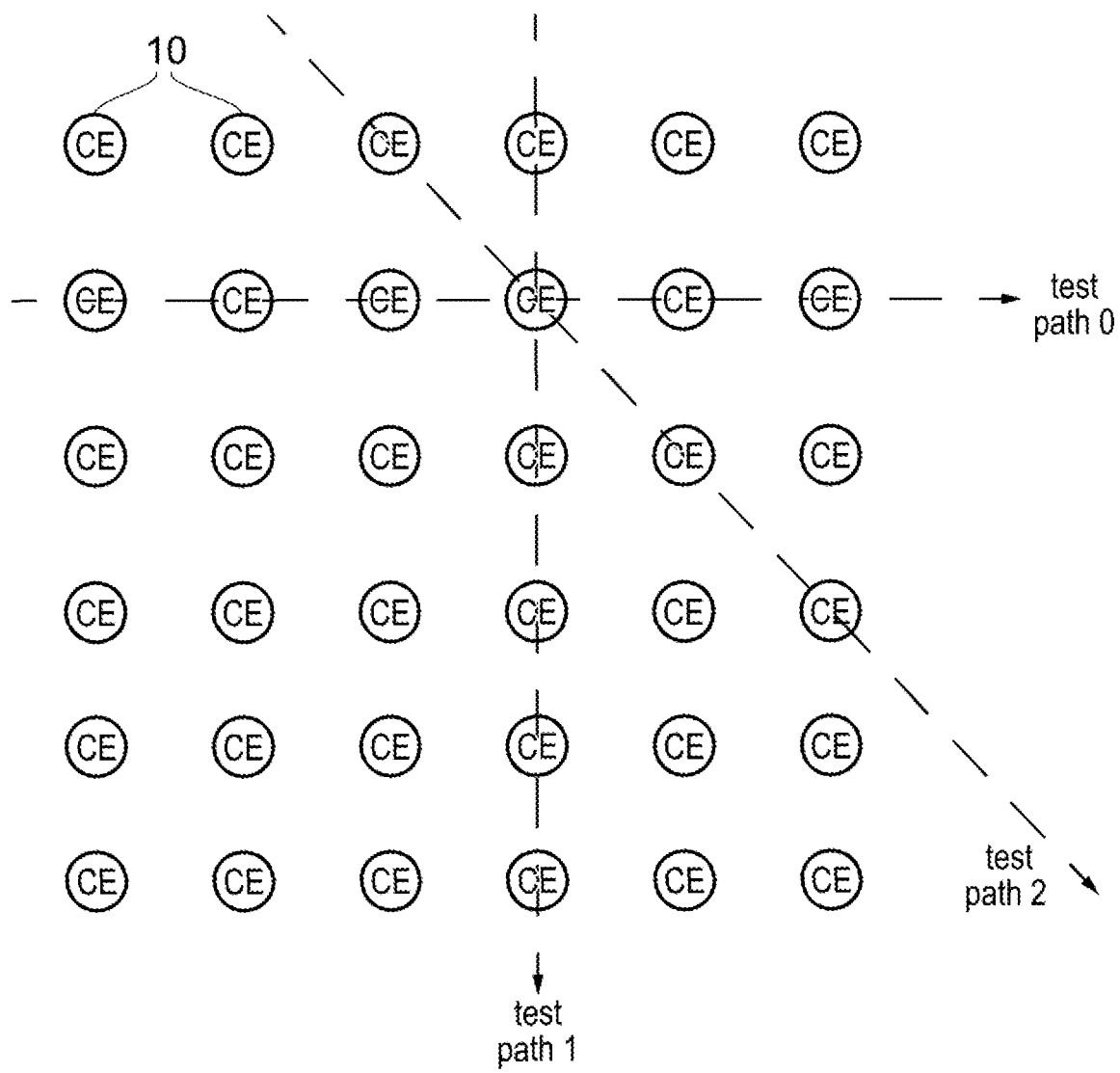
FIG. 9 schematically illustrates an array of circuit elements with test paths following rows, columns and diagonals through the array.

FIG. 9 schematically illustrates an array of circuit elements 10 with three test path directions being utilised. In this example embodiment, row-by-row testing and column-by-column testing are performed in addition to testing on a diagonal-by-diagonal basis using "test path 2". The integrated circuits and testing circuits within each respective row, column or diagonal are operated in parallel with each other and produce their own respective combined test result signals in a manner which avoids the need for individual separate testing of each circuit element 10. The three combined test result signals are combined to more accurately identify individual faulty circuit elements 10 in a way more robust to the occurrence of multiple clustered circuit element failures. Other combinations of multiple test paths are also possible if further disambiguation is desirable.

Figure 10:
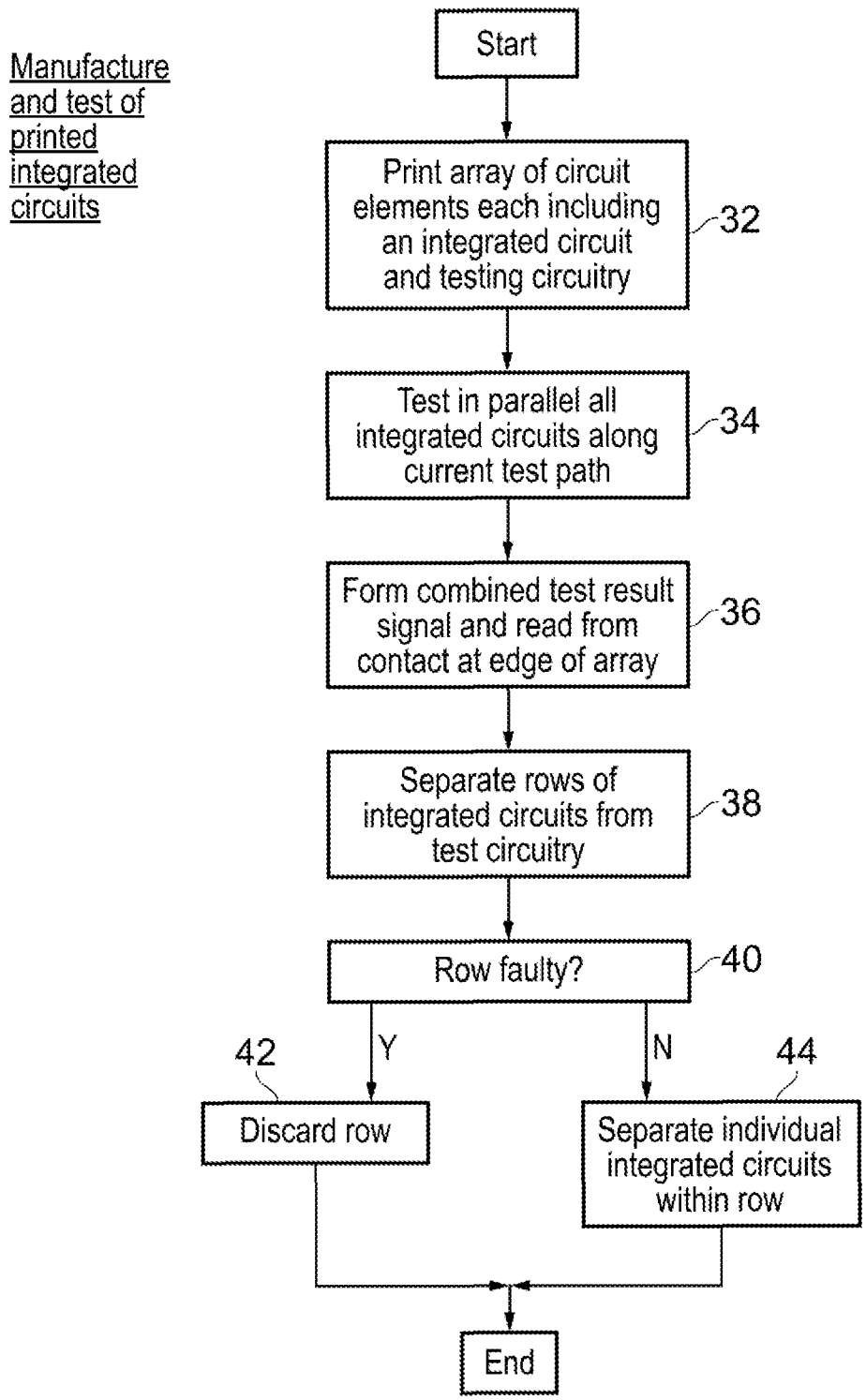
FIG. 10 is a flow diagram schematically illustrating the manufacture and test of printed integrated circuits.

FIG. 10 is a flow diagram schematically illustrating the manufacturing and testing of printed integrated circuits. At step 32 an array of circuit elements each including an integrated circuit 12 and testing circuitry 14 are printed on a substrate. At step 34 testing is performed in parallel by the testing circuits 14 upon their respective individual integrated circuits 12 for all of the circuit elements along a currently active test path. At step 36 the individual test result signals from each of the individual tests performed in parallel at step 34 are combined to form a combined test result signal and this is output and read from a contact 20 at the edge of the array. Step 38 separates the rows of integrated circuits 12 from each other and from their corresponding test circuitry 14. Step 40 determines whether or not each individual row of integrated circuits which has been separated at step 38 was identified at step 36 using its combined test result signal as containing at least one faulty integrated circuit 12. If the determination at step 40 is that a row of integrated circuits 12 contains at least one faulty integrated circuit, then step 42 discards that row. If the determination at step 40 is that the row concerned does not contain any faulty integrated circuits 12, then step 44 separates the individual integrated circuits 12 within the row and these are passed forward for use.

It is possible in some example embodiments that the roll of printed integrated circuits 12 could be kept together and accompanied by data (such as on a data storage medium or transmitted with a cross-referencing identifier to the roll concerned) identifying rows containing at least one faulty integrated circuit 12 (or identifying a particular faulty integrated circuit 12). The accompanying data could then be later used in a different process (possibly in a different location) to separate out and discard the integrated circuits 12 identified as faulty.

It will be appreciated that the flow diagram of FIG. 10 illustrates the processing performed in respect of a single row and in practice such processing is performed repeatedly in an overlapping fashion for each row which is printed as part of a continuous roll-to-roll printed integrated circuit manufacturing process. The process of FIG. 9 may be adapted in the case of sheet-to-sheet processing whereby rows of integrated circuits containing a faulty integrated circuit, or an individual integrated circuit identified as faulty, may be discarded at the latter stages of the processing, such as by not being separated from the substrate and their associated testing circuit and instead discarded.

The invention claimed is:

1. A method of manufacturing integrated circuits comprising the steps of:
    forming an array comprising a plurality of circuit elements, a circuit element comprising an integrated circuit and a testing circuit to test for correct operation of said integrated circuit;
    testing in parallel a plurality of said integrated circuits using respective testing circuits to generate a plurality of test result signals;
    combining said plurality of test result signals to form a combined test result signal having a first value when any of said plurality of test result signals indicates that a corresponding integrated circuit operated incorrectly during said testing and a second value when all of said plurality of test result signals indicate that said plurality of integrated circuits operated correctly during said testing; and
    at least partially separating said array to form a plurality of discrete integrated circuits,
    wherein said forming comprises forming said array on a sheet of flexible substrate moving through a forming apparatus in a transport direction and said plurality of integrated circuits tested in parallel extend across said sheet transverse to said transport direction between a first lateral edge of said sheet and a second lateral edge of said sheet.

2. A method as claimed in claim 1, comprising, when said combined test result signal has said first value, discarding as faulty said plurality of integrated circuits.

3. A method as claimed in claim 1, comprising separating said integrated circuits from said testing circuits subsequent to said testing.

4. A method as claimed in claim 1, wherein said forming comprises forming said array on said flexible substrate.

5. A method as claimed in claim 4, wherein said forming comprises one of sheet-to-sheet printing and roll-to-roll printing.

6. A method as claimed in claim 1, wherein said combined test result signal is routed to an edge of said array to be read.

7. A method as claimed in claim 1, wherein said plurality of integrated circuits tested in parallel are disposed along a test path extending through said array from proximal a first edge of said array to proximal a second edge of said array opposite from said first edge.

8. A method as claimed in claim 1, wherein said plurality of integrated circuits tested in parallel are part of a two-dimensional test block of circuit elements, first test paths extend through said block from proximal a first edge of said block to proximal a second edge of said block opposite from said first edge, and second test paths extend through said block transverse to said first test paths from proximal a third edge of said block to proximal a fourth edge of said block opposite from said third edge.

9. A method as claimed in claim 8, wherein said testing is performed in parallel for said integrated circuits within said block with test result signals from integrated circuits along said first test paths being combined to form respective first combined test result signals and test result signals from integrated circuits along said second test paths being combined to form respective second combined signals.

10. A method as claimed in claim 9, comprising identifying a given integrated circuit as faulty when a first combined test signal from a first test path comprising said given integrated circuit has a first given value and a second combined test signal from a second test path comprising said given integrated circuit has a second given value.

11. A method as claimed in claim 1, comprising supplying electrical power in parallel to said plurality of integrated circuits and respective testing circuits during said testing via power conductors extending across said array to power connections at an edge of said array.

12. A method as claimed in claim 1, comprising supplying a clock signal in parallel to said plurality of integrated circuits and respective testing circuits during said testing via a clock conductor extending across said array to a clock connection at an edge of said array.

13. A method as claimed in claim 1, comprising supplying a clock signal starting at different times to respective integrated circuits of said plurality of integrated circuits.

14. A method as claimed in claim 1, wherein electrical contacts connected to said plurality of circuit elements are disposed at least one of said first lateral edge and said second lateral edge.

15. A method as claimed in claim 14, wherein said electrical contacts extend in said transport direction a distance matched to a pitch distance of said circuit elements within said array in said transport direction.

16. A method as claimed in claim 15, wherein said electrical contacts extending in said transport direction a distance corresponding to a plurality of said pitch distances with electrical contacts for different pluralities of circuit elements overlapping in said transport direction.

17. A method as claimed in claim 1, wherein said testing circuits are disposed between said integrated circuits in said transport direction.

18. A method of manufacturing integrated circuits comprising the steps of:
    forming an array comprising a plurality of circuit elements, a circuit element comprising an integrated circuit and a testing circuit to test for correct operation of said integrated circuit;
    testing in parallel a plurality of said integrated circuits using respective testing circuits to generate a plurality of test result signals;
    combining said plurality of test result signals to form a combined test result signal having a first value when any of said plurality of test result signals indicates that a corresponding integrated circuit operated incorrectly during said testing and a second value when all of said plurality of test result signals indicate that said plurality of integrated circuits operated correctly during said testing; and at least partially separating said array to form a plurality of discrete integrated circuits, wherein said forming comprises forming said array on a sheet of substrate held stationary relative to a forming apparatus with electrical contacts connected to said array of circuit elements extending around a circumference of said sheet.

19. An array of circuit elements, a circuit element comprising an integrated circuit and a testing circuit to test for correct operation of said integrated circuit, wherein said integrated circuits and said testing circuits are connected:

to test in parallel a plurality of said integrated circuits using respective testing circuits to generated a plurality of test result signals; and to combine said plurality of test result signals to form a combined test result signal having a first value when any of said plurality of test result signals indicates that a corresponding integrated circuit operated incorrectly during said test and a second value when all of said plurality of test result signals indicate that said plurality of integrated circuits operated correctly during said test, and wherein said array is formed to be at least partially separated to provide discrete integrated circuits for non-test operations, wherein said array is formed on a sheet of flexible substrate moving through a forming apparatus in a transport direction and said plurality of integrated circuits tested in parallel extend across said sheet transverse to said transport direction between a first lateral edge of said sheet and a second lateral edge of said sheet.

* * * * *